United States Patent
Taniguchi et al.

(10) Patent No.: US 6,870,203 B2
(45) Date of Patent: Mar. 22, 2005

(54) FIELD-EFFECT SEMICONDUCTOR DEVICE AND METHOD FOR MAKING THE SAME

(75) Inventors: Satoshi Taniguchi, Kanagawa (JP); Toshikazu Suzuki, Kanagawa (JP); Hideki Ono, Tokyo (JP); Jun Araseki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/287,682

(22) Filed: Nov. 5, 2002

(65) Prior Publication Data

US 2003/0107065 A1 Jun. 12, 2003

(30) Foreign Application Priority Data

Nov. 6, 2001 (JP) ........................ 2001-340432
Dec. 17, 2001 (JP) ........................ 2001-382755

(51) Int. Cl.$^7$ ............................................ H01L 29/778
(52) U.S. Cl. ............................... 257/194; 257/769
(58) Field of Search ............................ 257/194, 769

(56) References Cited

U.S. PATENT DOCUMENTS

| | | | | |
|---|---|---|---|---|
| 5,053,348 A | * | 10/1991 | Mishra et al. | 438/571 |
| 6,448,648 B1 | * | 9/2002 | Boos | 257/751 |
| 6,492,669 B2 | * | 12/2002 | Nakayama et al. | 257/282 |
| 6,573,599 B1 | * | 6/2003 | Burton et al. | 257/745 |
| 2001/0023964 A1 | * | 9/2001 | Wu et al. | 257/368 |

FOREIGN PATENT DOCUMENTS

JP          2001-102565          4/2001

* cited by examiner

*Primary Examiner*—Jerome Jackson
(74) *Attorney, Agent, or Firm*—Oblon, Spivak, McClelland, Maier & Neustadt, P.C.

(57) ABSTRACT

A method for making a filed-effect semiconductor device includes the steps of forming a gate electrode on a semiconductor layer composed of a gallium nitride-based compound semiconductor represented by the formula $Al_xIn_yGa_{1-x-y}N$, wherein $x+y=1$, $0 \leq x \leq 1$, and $0 \leq y \leq 1$; and forming a source electrode and a drain electrode by self-alignment using the gate electrode as a mask. A field-effect semiconductor device fabricated by the method is also disclosed.

6 Claims, 17 Drawing Sheets

FIG. 6A
FIG. 6B
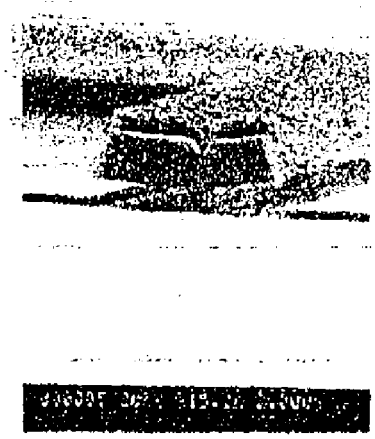
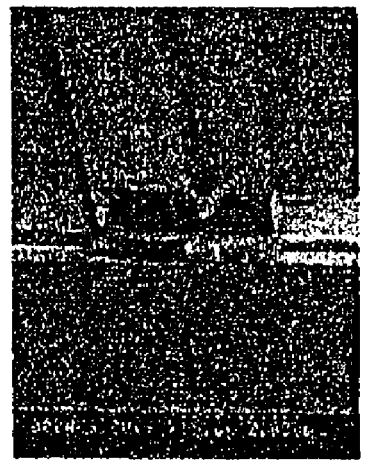

FIELD-EFFECT SEMICONDUCTOR DEVICE AND METHOD FOR MAKING THE SAME

BACKGROUND OF THE INVENTION

1. Field of the Invention

The present invention relates to field-effect semiconductor devices and methods for making the same.

2. Description of the Related Art

In order to improve the characteristics of a field-effect transistor, it is important to reduce resistance of the gate electrode and to reduce parasitic resistance between the gate electrode and the source electrode and between the gate electrode and the drain electrode.

In GaN-based field-effect transistors, in most cases, gate electrodes, source electrodes, and drain electrodes are formed by patterning in sequence.

FIGS. 10A to 10F are sectional views which schematically show the steps in an example of a method for fabricating a GaN-based field-effect transistor.

First, as shown in FIG. 10A, a non-doped GaN layer 14 with a thickness of approximately 1 to 2 μm, a non-doped AlGaN spacer layer 15 with a thickness of 3 to 5 nm, a Si-doped AlGaN layer 16 with a thickness of 10 to 30 nm, and a non-doped AlGaN cap layer 17 with a thickness of 5 to 15 nm are formed in that order on an insulating substrate 12, such as a sapphire substrate or a SiC substrate, by a molecular beam epitaxy (MBE) process or a metal organic chemical vapor deposition (MOCVD) process.

As shown in FIG. 10B, an insulating film 2, such as a $SiO_2$ insulating film, is formed, with a thickness of 20 to 30 nm, on the AlGaN cap layer 17 by a plasma-enhanced chemical vapor deposition (CVD) process or an electron-beam (EB) vapor deposition process. Next, although not shown in the drawing, a resist layer having a pattern with the dimensions of the device is formed, and the regions other than the operation layer is insulated by ion implantation, for example, using boron or nitrogen.

A gate electrode-forming resist layer 3 provided with an opening with a predetermined size is then placed on the $SiO_2$ insulating film 2. A portion of the $SiO_2$ insulating film 2 corresponding to the gate electrode-forming region is removed by $CF_4$-based dry etching or HF-based wet etching.

Next, as shown in FIG. 10C, a gate electrode metal, for example, composed of Ni/Au, is deposited through the opening of the gate electrode-forming resist layer 3 to form a gate electrode 21. After the gate electrode metal is deposited, the resist layer 3 and the gate electrode metal which is deposited on the resist layer 3 and which is shown in phantom lines in FIG. 10C are removed by a lift-off process.

As shown in FIG. 10D, a resist layer 22 provided with openings for forming a source electrode and a drain electrode which are located at predetermined positions on both sides of the gate electrode 21 are formed by patterning. Portions of the $SiO_2$ insulating film 2 corresponding to the regions for forming the source electrode and the drain electrode are removed again by dry etching or wet etching.

As shown in FIG. 10E, an ohmic metal, for example, Ti/Al, is deposited through the openings for forming the source electrode and the drain electrode, and a source electrode 8 and a drain electrode 9 are formed by a lift-off process.

Next, as shown in FIG. 10F, the ohmic metal (Ti/Al) constituting the source electrode 8 and the drain electrode 9 is alloyed, for example, using an infrared alloying furnace or a heat alloying furnace, and satisfactory ohmic contacts are obtained. An insulating film 23 composed of $SiO_2$, SiN, or the like is then formed thereon, and the insulating film 23 formed on the electrodes is removed. A GaN-based field-effect transistor is thereby completed.

FIGS. 11A to 11C are sectional views which schematically show the steps in another example of a method for fabricating a GaN-based field-effect transistor.

First, as shown in FIG. 11A, an insulating film 2, such as a $SiO_2$ insulating film, is formed, with a thickness of 20 to 30 nm, on an AlGaN cap layer 17 by a plasma-enhanced CVD process or an EB vapor deposition process. Next, although not shown in the drawing, a resist layer having a pattern with the dimensions of the device is formed, and the regions other than the operation layer is insulated by ion implantation, for example, using boron or nitrogen. A gate electrode-forming resist layer (first resist layer) 3 provided with an opening with a predetermined size is then formed on the $SiO_2$ insulating film 2. A portion of the $SiO_2$ insulating film 2 corresponding to the gate electrode-forming region is removed by $CF_4$-based dry etching or HF-based wet etching.

A third resist layer 5 for forming a T-shaped gate electrode and a second resist layer 4 for preventing the mixture of the first resist layer 3 and the third resist layer 5 are placed on the gate electrode-forming resist layer 3, and an opening is formed again for the gate electrode-forming region. A portion of the $SiO_2$ insulating film 2 corresponding to the T-shaped gate electrode-forming region is removed. A gate electrode metal, for example, composed of Ni/Au, is deposited through the opening, and a T-shaped gate electrode 6 is thereby formed. After the gate electrode metal is deposited, the resist layers 3 to 5 and the gate electrode metal deposited on the third resist layer 5 are removed by a lift-off process.

As shown in FIG. 11B, a resist layer 22 provided with openings for forming a source electrode and a drain electrode which are located at predetermined positions on both sides of the T-shaped gate electrode 6 are formed by patterning. Portions of the $SiO_2$ insulating film 2 corresponding to the regions for forming the source electrode and the drain electrode are removed. As shown in FIG. 11C, an ohmic metal (Ti/Al) is deposited through the openings for forming the source electrode and the drain electrode to form a source electrode 8 and a drain electrode 9, and the resist layer 22 is removed by a lift-off process. After the source electrode 8 and the drain electrode 9 are formed, a GaN-based field-effect transistor is completed in the same manner as that described above.

However, in each of the methods for fabricating the GaN-based field-effect transistors described above, since the source electrode and the drain electrode are aligned by the exposure of the resist, it is impossible to reduce the distance between the gate electrode and the source electrode or the distance between the gate electrode and the drain electrode to a value below the alignment accuracy or the minimum dimensional precision of an exposure apparatus. Therefore, the resistance between the source and the gate and the resistance between the drain and the gate may be increased, resulting in a degradation in the device characteristics and also resulting in inferior uniformity and consistency among devices.

SUMMARY OF THE INVENTION

It is an object of the present invention to provide a field-effect semiconductor device and a method for making the same in which parasitic resistance due to the distances between the gate electrode and the source electrode and between the gate electrode and the drain electrode can be decreased, and thereby the device characteristics can be improved and excellent uniformity and consistency among devices can be obtained.

In one aspect of the present invention, a method for making a field-effect semiconductor device includes the steps of forming a gate electrode on a semiconductor layer composed of a gallium nitride-based compound semiconductor represented by the formula $Al_xIn_yGa_{1-x-y}N$, wherein x+y=1, $0 \leq x \leq 1$, and $0 \leq y \leq 1$; and forming a source electrode and a drain electrode by self-alignment using the gate electrode as a mask.

In another aspect of the present invention, a field-effect semiconductor device includes a semiconductor layer composed of a gallium nitride-based compound semiconductor represented by the formula $Al_xIn_yGa_{1-x-y}N$, wherein x+y=1, $0 \leq x \leq 1$, and $0 \leq y \leq 1$; a gate electrode formed on the semiconductor layer; and a source electrode and a drain electrode formed by self-alignment using the gate electrode as a mask.

In accordance with the present invention, in the field-effect semiconductor device and the method for making the same, since the source electrode and the drain electrode are formed in the self-alignment manner using the gate electrode as the mask, the distances between the gate electrode and the source electrode and between the gate electrode and the drain electrode can be reduced, and it is possible to fabricate the devices uniformly and with a high degree of consistency.

Consequently, variations in parasitic resistance, such as the resistance between the source and the gate or the resistance between the drain and the gate, can be decreased and the parasitic resistance can be minimized, and therefore, it is possible to obtain an excellent field-effect semiconductor device with improved characteristics.

FIG. 10F or FIG. 11C shows an example of a gallium nitride-based compound semiconductor device in which a GaN layer 14, an AlGaN spacer layer 15, a Si-doped AlGaN layer 16, an AlGaN cap layer 17 are deposited in that order on a sapphire substrate 12, and a gate electrode 21 (or a T-shaped gate electrode 6), a source electrode 8, and a drain electrode 9 are formed by patterning on the AlGaN cap layer 17.

Additionally, regions beneath the source electrode 8 and the drain electrode 9 are alloyed so as to come into ohmic contact with the GaN layer 14 which is a channel layer (not shown in the drawings). The AlGaN spacer layer 15 is provided in order to isolate the GaN layer 14 from donors (Si) in the Si-doped AlGaN layer 16 which is a carrier-supplying layer.

The gallium nitride-based compound semiconductor device is operated by applying a bias to the gate electrode 21 (or 6), the source electrode 8, and the drain electrode 9. Carriers are supplied by the Si-doped AlGaN layer 16 and by spontaneous polarization and piezoelectric polarization. That is, when a bias is applied to the gate electrode 21 (or 6), carriers beneath the gate electrode are modulated. The carriers are transmitted by the voltage applied to the source electrode 8 and the drain electrode 9 through the GaN layer 14 which is a channel layer, and when they reach the end of the drain electrode 9, they are transferred into the drain electrode 9 through the alloyed region beneath the drain electrode 9.

As described above, in order to improve the characteristics of the field-effect semiconductor device, it is important to reduce parasitic resistance by decreasing the distances between the gate electrode 21 (or the T-shaped gate electrode 6) and the source electrode 8 and between the gate electrode 21 (or the T-shaped gate electrode 6) and the drain electrode 9. The reason for this is that the measured transconductance (gm) is represented by the equation (1) below, and by decreasing the source resistance (Rs) and the drain resistance (Rd), the transconductance is brought closer to the true transconductance.

$$gm = gm_0/(1 + gm_0 \times Rs + gd(Rs + Rd)) \quad (1)$$

wherein, gm is the apparent transconductance, $gm_0$ is the true transconductance, gd is the drain conductance, Rs is the source resistance, and Rd is the drain resistance.

When the regions beneath the source electrode 8 and the drain electrode 9 are alloyed so as to come into ohmic contact with the GaN layer 14, metallic atoms constituting the electrodes may be diffused in the transverse direction in the individual layers, resulting in short-circuiting, and the characteristics of the field-effect semiconductor device may be degraded.

However, the present inventors have carried out research on the problems described above and have found that by forming the source electrode and the drain electrode in a self-alignment manner using the gate electrode as a mask, it is possible to decrease the distances between the gate electrode and the source electrode and between the gate electrode and the drain electrode, and that even if the distances between the electrodes are decreased, in the gallium nitride-based compound semiconductor device, the problems as described above do not occur.

That is, specifically, since the source electrode and the drain electrode are formed in the self-alignment manner, the distances between the electrodes can be decreased, and devices can be fabricated uniformly and with a high degree of consistency. Therefore, while decreasing the variation in parasitic resistance due to the resistance between the source and gate, the resistance between the drain and the gate, etc. and minimizing the parasitic resistance, carrier transfer efficiency can be maintained satisfactorily. In other words, sufficient carriers can be supplied to the GaN layer 14 beneath the gate because of the reduction in resistance in response to the decrease in the distance between the source electrode and the drain electrode, because of the Si-doped AlGaN layer 16, and because of the piezoelectric effect and spontaneous polarization. Moreover, since a distance can be secured accurately between the alloyed regions beneath the source electrode and the drain electrode, short-circuiting does not occur. As described above, it has been found that an excellent gallium nitride-based field-effect semiconductor device with improved characteristics can be produced, and the present invention has been thereby achieved.

In the field-effect semiconductor device of the present invention, preferably, a spacer layer, a Si-containing carrier-supplying layer, and a cap layer which are composed of the gallium nitride-based compound semiconductor represented by the formula $Al_xIn_yGa_{1-x-y}N$ are deposited in that order on a GaN-based channel layer, and the gate electrode, the source electrode, and the drain electrode are formed on the cap layer.

Preferably, after the gate electrode is formed into a predetermined pattern, the source electrode and the drain electrode are formed in the self-alignment manner by vapor deposition using an electrode material. More specifically, as will be described below, the gate electrode is preferably formed so as to have a T-shaped cross section.

By forming the gate electrode so as to have the T-shaped cross section, the resistance of the gate electrode can be reduced, and the characteristics of the field-effect semiconductor device can be further improved.

BRIEF DESCRIPTION OF THE DRAWINGS

FIGS. 6A and 6B are scanning electron microscope (SEM) images of a device before and after the removal of the ohmic metal deposited on the gate electrode;

DESCRIPTION OF THE PREFERRED EMBODIMENTS

Figure 1A:
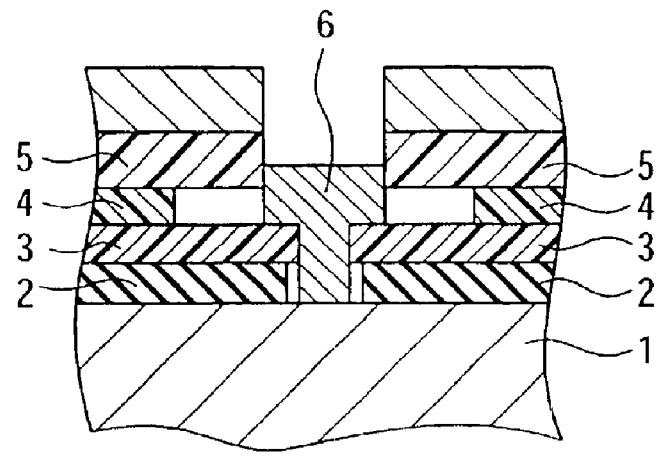
FIGS. 1A to 1F are sectional views which schematically show the steps in a method for fabricating a field-effect semiconductor device in an embodiment of the present invention.
Figure 1B:
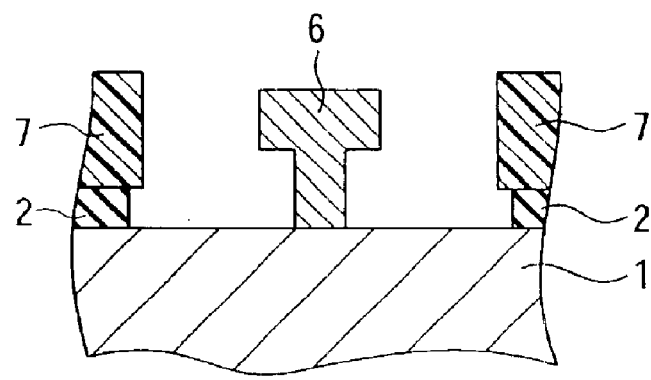
Figure 1C:
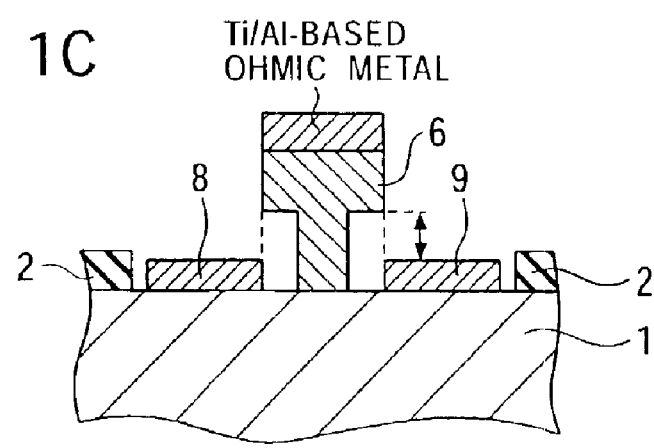

FIGS. 1A to 1C are sectional views which schematically show the steps in a method for fabricating a field-effect semiconductor device in an embodiment of the present invention.

First, as shown in FIG. 1A, an insulating film 2 composed of SiO$_2$ or the like is deposited on a compound semiconductor base 1 including a sapphire substrate, etc. A first resist layer 3 which determines the gate electrode length, and a second resist layer 4 and a third resist layer 5 which are used for forming an overhang of a T-shaped gate electrode are placed on the SiO$_2$ insulating film 2, and an opening with a predetermined size is formed. An opening is also formed in the SiO$_2$ insulating film 2. In order to form the opening in the SiO$_2$ insulating film 2, dry etching with high anisotropy using CF$_4$, etc. or wet etching using an HF-based etchant may be employed. Additionally, when the SiO$_2$ insulating film is not required, the resist layers 3 to 5 are directly placed on the base 1, and an opening for the gate electrode is formed.

Next, after the surface of the semiconductor base 1 provided with the openings is cleaned, a metal, such as Ni/Au, for forming the gate electrode is deposited. The resist layers 3 to 5 and the Ni/Au deposited on the third resist layer 5 are removed by a lift-off process, and a gate electrode 6 having a T-shaped cross section is thereby completed. Since the gate electrode 6 has the T-shaped cross section, the resistance of the gate electrode 6 can be decreased, and the characteristics of the field-effect semiconductor device can be further improved.

Next, as shown in FIGS. 1B and 1C, after the T-shaped gate electrode 6 is formed, the source electrode and the drain electrode are formed in a self-alignment manner using the T-shaped gate electrode 6 as a mask. For example, the source electrode and the drain electrode may be formed by a lift-off process or etching.

When the lift-off process is employed, a resist layer 7 is placed on the entire surface of the semiconductor base 1 including the T-shaped gate electrode 6, and then, as shown in FIG. 1B, an opening is formed in the resist layer 7 and portions of the SiO$_2$ insulating film 2 corresponding to the regions for forming the source electrode and the drain electrode are removed. After the semiconductor base 1 at the openings and the metal surface are cleaned, an electrode material for the source electrode and the drain electrode, for example, a Ti/Al-based ohmic metal, is deposited. The resist layer 7 is then removed by a lift-off process, and the source electrode 8 and the drain electrode 9 are thereby completed. As shown in FIG. 1C, the Ti/Al-based ohmic metal is deposited on the source electrode-forming region, the drain electrode-forming region, and the top of the gate electrode 6 separately due to the presence of the overhang of the T-shaped gate electrode 6. It is important that the source electrode 8 and the drain electrode 9 are lower than the bottom face of the overhang of the T-shaped gate electrode 6. If the source electrode 8 and the drain electrode 9 are higher than the overhang of the T-shaped gate electrode 6, short-circuiting may occur between the electrodes.

Although not shown in the drawing, when etching is employed, first, an electrode material for the source electrode 8 and the drain electrode 9, for example, a Ti/Al-based ohmic metal, is deposited over the entire surface of the semiconductor base 1. A resist layer provided with openings for the regions in which the ohmic metal is to be removed is placed on the ohmic metal layer, and the ohmic metal is removed by wet treatment or milling treatment.

Since the source electrode 8 and the drain electrode 9 are formed in the self-alignment manner using the T-shaped gate electrode 6 as the mask, the distances between the gate electrode 6 and the source electrode 8 and between the gate electrode 6 and the drain electrode 9 are determined when the T-shaped gate electrode 6 is formed without depending on the fabrication step of the source electrode 8 and the drain electrode 9. Consequently, in the field-effect semiconductor device of the present invention, if only formation accuracy of the T-shaped gate electrode 6 is improved, the distances between the electrodes can be decreased, and also it is possible to fabricate devices more uniformly and with a higher degree of consistency. Therefore, while decreasing the variation in parasitic resistance due to the resistance between the source and gate, the resistance between the drain and the gate, etc. and minimizing the parasitic resistance, carrier transfer efficiency can be maintained satisfactorily. That is, sufficient carriers can be supplied to a GaN layer 14 beneath the gate because of the reduction in resistance in response to the decrease in the distance between the source electrode and the drain electrode, because of a Si-doped AlGaN layer 16, and because of the piezoelectric effect and spontaneous polarization. Moreover, since a distance can be secured accurately between the alloyed regions beneath the source electrode and the drain electrode, short-circuiting does not occur. As a result, it is possible to produce an excellent gallium nitride-based field-effect semiconductor device with improved characteristics.

In the method for fabricating the field-effect semiconductor device of the present invention, after the T-shaped gate electrode 6, the source electrode 8, and the drain electrode 9 are formed (refer to FIG. 1C), preferably, regions beneath the source electrode 8 and the drain electrode 9 are alloyed so as to come into ohmic contact with a channel layer (not shown in the drawings). However, when such alloying treatment is performed, the ohmic metal deposited on the gate electrode 6 may affect the gate metal-semiconductor junction which provides satisfactory Schottky characteristics and degrade the gate electrode characteristics, resulting in a degradation in the characteristics of the field-effect semiconductor device. The present inventors have carried out research on the degradation in the gate electrode characteristics caused by the ohmic metal during the alloying treatment and have found that the problems described above can be overcome by at least partially forming the gate electrode 6 using a high-melting-point metal.

That is, preferably, the gate electrode 6 has a multi-layered structure including a layer composed of a high-melting-point metal. Preferably, at least one metal selected from the group consisting of Mo, Pt, W, Hf, and Cr is used as the high-melting-point metal. A high-melting-point metal with a higher melting point functions more suitably as a barrier metal even if the layer thickness thereof is small. Preferably, the high-melting-point metal layer has a thickness of 200 nm or more.

By partially forming the multi-layered structure using the high-melting-point metal layer, the ohmic metal does not affect the Schottky characteristics of the gate electrode metal and the semiconductor, and thus it is possible to avoid the degradation in the gate electrode characteristics.

Figure 1D:
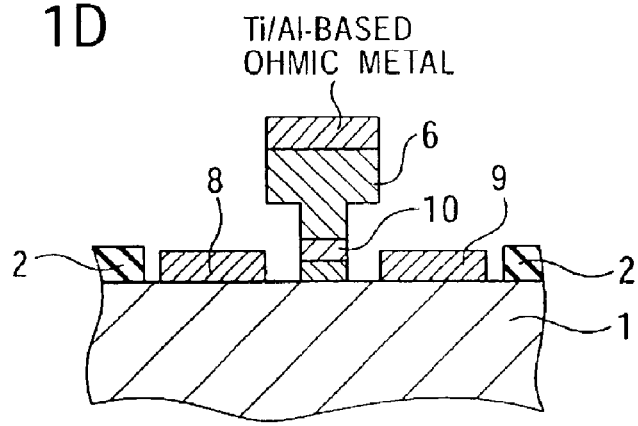

FIG. 1D is a sectional view which schematically shows a field-effect semiconductor device of the present invention in which the gate electrode 6 has a multi-layered structure and the multi-layered structure includes a high-melting-point metal layer.

In order to fabricate the field-effect semiconductor device shown in FIG. 1D, first, when the T-shaped gate electrode 6 shown in FIG. 1A is formed, a gate electrode metal group, such as Ni/Pt/Au or Ni/Mo/Au, including at least one high-melting-point metal selected from the group consisting of Mo, Pt, W, Hf, and Cr is deposited. The resist layers 3 to 5 are then removed by the lift-off process, and the T-shaped gate electrode 6 is thereby obtained. In the same manner as that described above, the electrode material for the source electrode 8 and the drain electrode 9 is vapor-deposited using the T-shaped gate electrode 6 as a mask to form the source electrode 8 and the drain electrode 9 in the self-alignment manner, and the lift-off process is performed. The field-effect semiconductor device of the present invention shown in FIG. 1D, in which the gate electrode 6 includes a high-melting-point metal layer 10, is thereby fabricated.

In the case in which the gate electrode 6 is formed without including a high-melting-point metal layer 10, it has also been found that by removing the electrode material, for example, the ohmic metal described above, deposited on the gate electrode 6 after the source electrode 8 and the drain electrode 9 are formed, the ohmic metal can be prevented from affecting the metal-semiconductor junction which provides satisfactory Schottky gate characteristics, and the degradation in the gate electrode can be avoided.

Figure 1E:
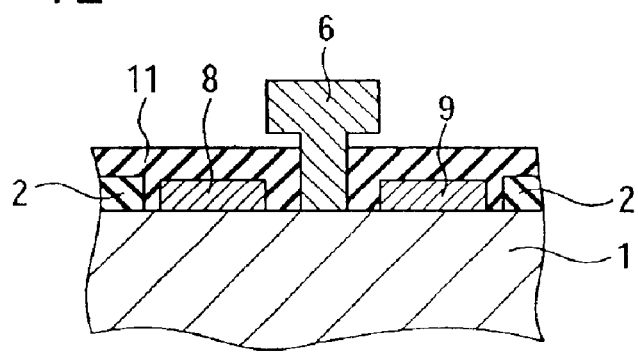
Figure 1F:
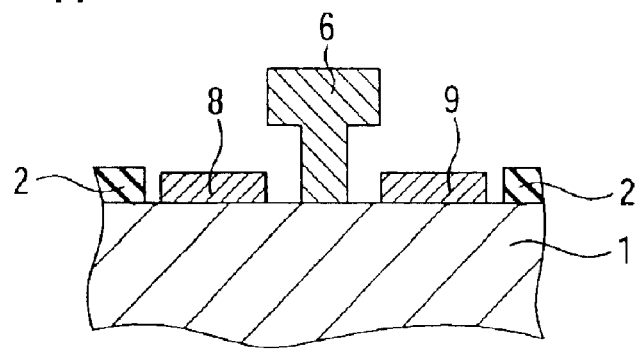

FIGS. 1E and 1F are sectional views which schematically show the steps of removing the ohmic metal deposited on the gate electrode 6.

First, after the T-shaped gate electrode 6 without including the high-melting-point metal layer, the source electrode 8, and the drain electrode 9 are formed in the same manner as that described above, a planarizing film 11 composed a resist or the like is placed thereon. As shown in FIG. 1E, the planarizing film 11 is removed by an etch back process until the overhang of the T-shaped gate electrode 6 is exposed. Next, only the ohmic metal which is the electrode material for forming the source electrode 8 and the drain electrode 9 and which is deposited on the T-shaped gate electrode 6 is removed by dry etching or wet etching, and the remaining planarizing layer 11 is removed (refer to FIG. 1F).

In this way, even when the gate electrode 6 does not include a high-melting-point metal layer 10, satisfactory gate electrode characteristics can be maintained.

As described above, in the method for fabricating the field-effect semiconductor device in accordance with the present invention, since the source electrode and the drain electrode are formed in the self-alignment manner using the gate electrode as the mask, the distances between the gate electrode and the source electrode and between the gate electrode and the drain electrode can be decreased, and it is possible to fabricate devices uniformly and with a high degree of consistency.

Consequently, variations in parasitic resistance, such as the resistance between the source and the gate or the resistance between the drain and the gate, can be decreased and the parasitic resistance can be minimized, and therefore, it is possible to produce an excellent field-effect semiconductor device with improved characteristics.

By forming the multi-layered structure including the high-melting-point metal layer, it is possible to prevent the ohmic metal which is the material for the source and drain electrodes and which is deposited on the gate electrode during the alloying treatment from affecting the gate electrode metal-semiconductor junction, and it is possible to produce a superior field-effect semiconductor device.

Furthermore, after the source electrode and the drain electrode are formed, by removing the ohmic metal which is the material for the source and drain electrodes and which is deposited on the gate electrode, it is possible to prevent the ohmic metal which is the material for the source and drain electrodes and which is deposited on the gate electrode during the alloying treatment from affecting the gate electrode metal-semiconductor junction, and it is possible to produce a superior field-effect semiconductor device.

The present invention will be described in detail based on the examples below.

EXAMPLE

An example of a field-effect semiconductor device of the present invention will be described, in which a gate electrode is formed so as to have a T-shaped cross section, the gate electrode having a multi-layered structure including a high-melting-point metal layer.

FIGS. 2A to 2F are sectional views which schematically show the steps in a method for fabricating a field-effect semiconductor device in accordance with the present invention.

Figure 2A:
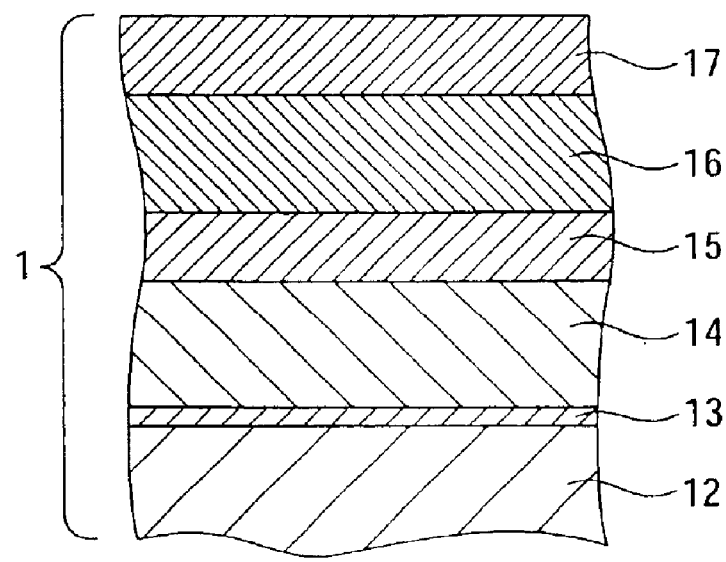
FIGS. 2A to 2F are sectional views which schematically show the steps in a method for fabricating a field-effect semiconductor device of the present invention.

As shown in FIG. 2A, an AlGaN low temperature buffer layer 13, a GaN high resistivity layer 14, an AlGaN spacer layer 15, a Si-doped AlGaN layer 16, and an AlGaN cap layer 17 were epitaxially grown in that order on a sapphire substrate 12, and thereby a compound semiconductor base 1 was formed. In the compound semiconductor base 1, a two-dimensional electron gas was formed in the vicinity of a heterojunction between the GaN high resistivity layer 14 and the AlGaN spacer layer 15 due to the piezoelectric effect and modulation doping.

Figure 2B:
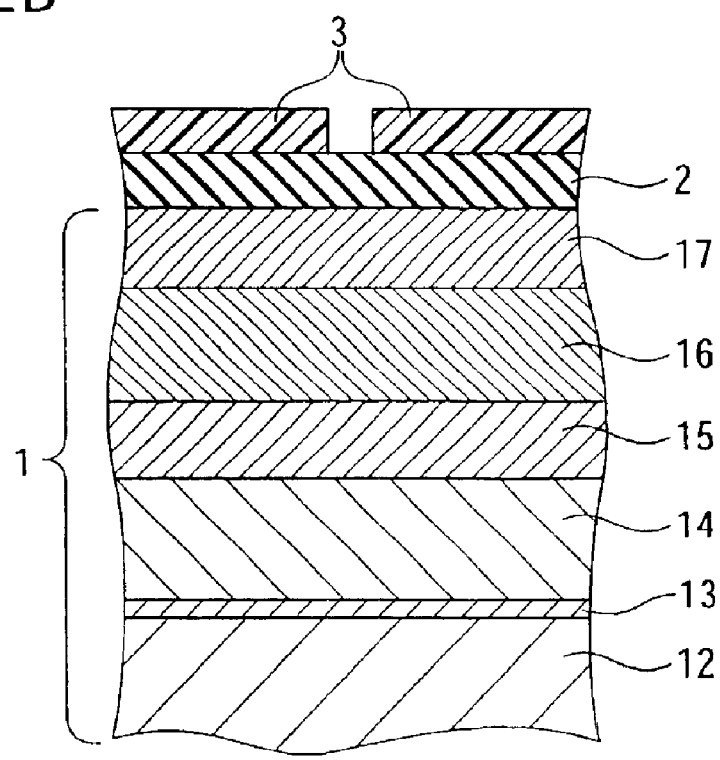

As shown in FIG. 2B, a SiO$_2$ insulating film 2 with a thickness of 20 nm was provided on the upper surface of the compound semiconductor base 1. A first resist layer 3 was placed on the SiO$_2$ film 2, and an opening for forming a gate-electrode region with a predetermined aperture was formed in the resist layer 3.

Figure 2C:
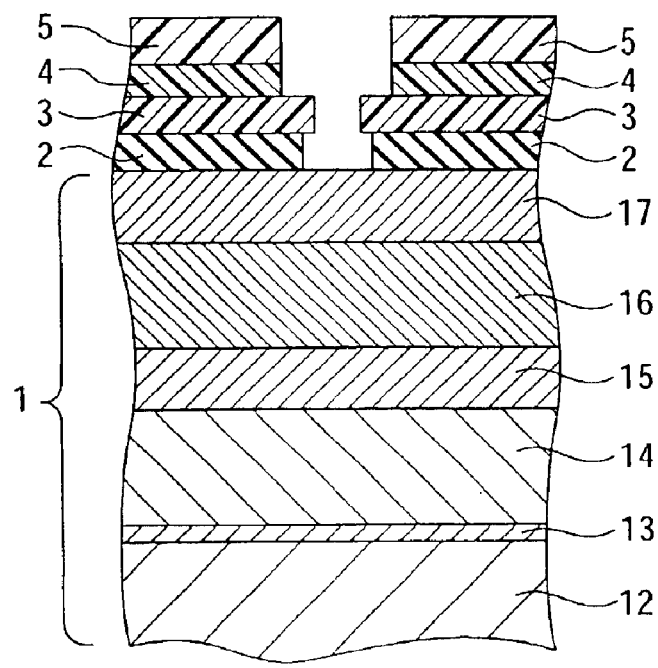

Next, as shown in FIG. 2C, a second resist layer 4 for preventing the mixture of the resists was placed on the first resist layer 3 provided with the opening. After a third resist layer 5 was placed further thereon, an opening corresponding to the size of the overhang of the T-shaped gate electrode was formed. A portion of the SiO$_2$ insulating film 2 corresponding to the gate electrode-forming region was removed, for example, by wet etching using an HF-based etchant to form an opening.

Figure 2D:
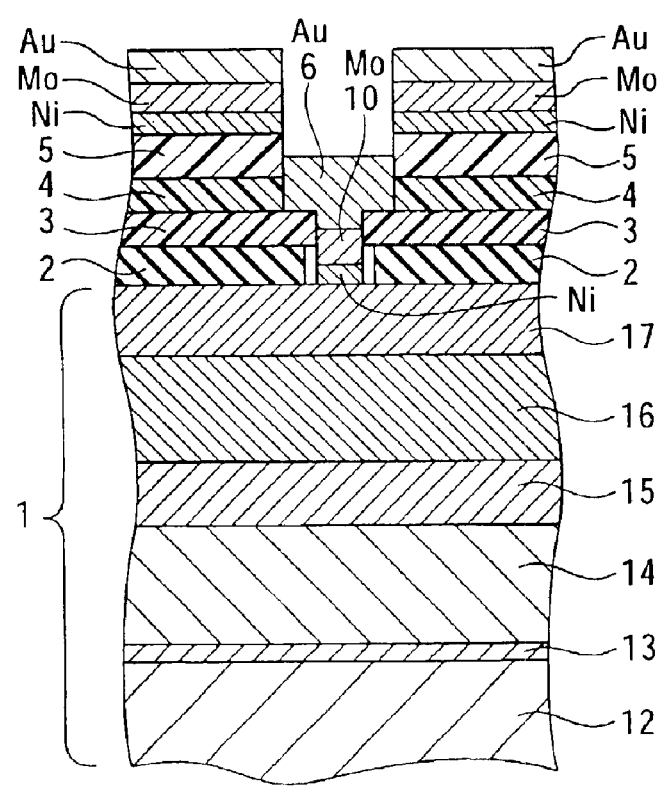

As shown in FIG. 2D, a Ni/Au-based gate metal including a high-melting-point metal, for example, Mo, was vapor-deposited. Ni, Mo, and Au were deposited in that order with a thickness of 60 nm, 300 nm, and 500 nm, respectively. The resist layers 3 to 5 were removed by the lift-off process after the vapor deposition, and the T-shaped gate electrode 6 was thereby produced.

Figure 2E:
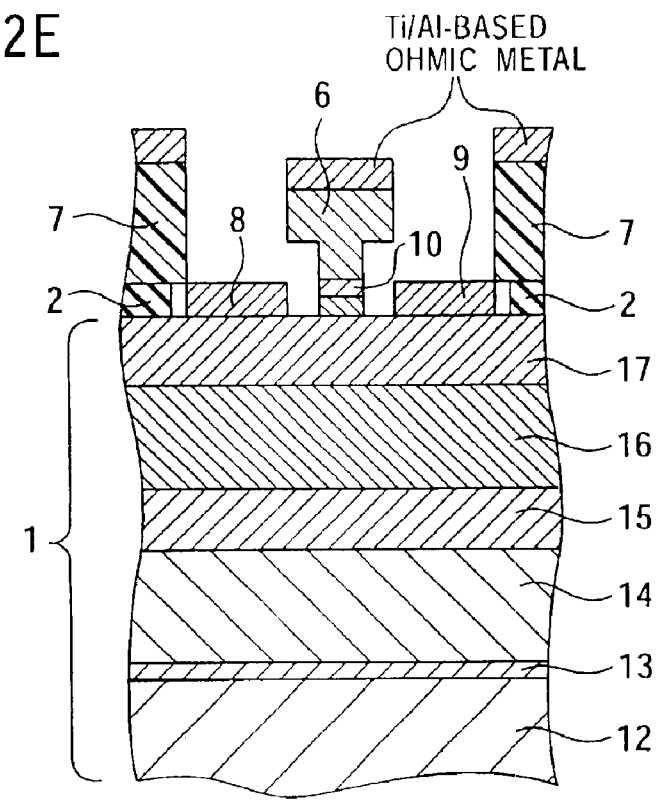

Next, a resist layer 7 was placed over the entire surface of the compound semiconductor base 1 including the T-shaped gate electrode 6. As shown in FIG. 2E, an opening was formed in the resist layer 7 at predetermined positions corresponding to the T-shaped gate electrode 6 and the regions for forming the source electrode and drain electrode, and portions of the SiO$_2$ insulating film 2 corresponding to the regions for forming the source electrode and the drain electrode were removed. A Ti/Al based ohmic metal as the material for the source electrode and the drain electrode was vapor-deposited, with a thickness of 10 nm and 200 nm, respectively, for Ti and Al. Thereby, it was possible to form the source electrode 8 and the drain electrode 9 in a self-alignment manner using the T-shaped gate electrode 6 as a mask. Next, by removing the resist layer 7 by the liftoff process, the source electrode 8 and the drain electrode 9 were completed (refer to FIG. 2F).

After the field-effect semiconductor device thus fabricated was cleaned, alloying treatment was performed by heating, for example, in a nitrogen atmosphere at 600° C. for 1.5 minutes to obtain a contact resistivity of $1.0 \times 10^{-5}$ $\Omega \cdot cm^2$ or less, and the fabrication of the device was thereby completed.

Since the source electrode 8 and the drain electrode 9 were formed in the self-alignment manner using the gate electrode 6 as the mask, it was possible to decrease the distances between the gate electrode and the source electrode and between the gate electrode and the drain electrode, and it was possible to fabricate devices uniformly and with a high degree of consistency.

Consequently, it was possible to decrease variations in parasitic resistance, such as the resistance between the source and the gate or the resistance between the drain and the gate, and to minimize the parasitic resistance, and therefore, it was possible to produce an excellent field-effect semiconductor device with improved characteristics.

Since the gate electrode 6 had the T-shaped cross section, the resistance of the gate electrode 6 was reduced, and it was possible to further improve the characteristics of the field-effect semiconductor device.

Figure 2F:
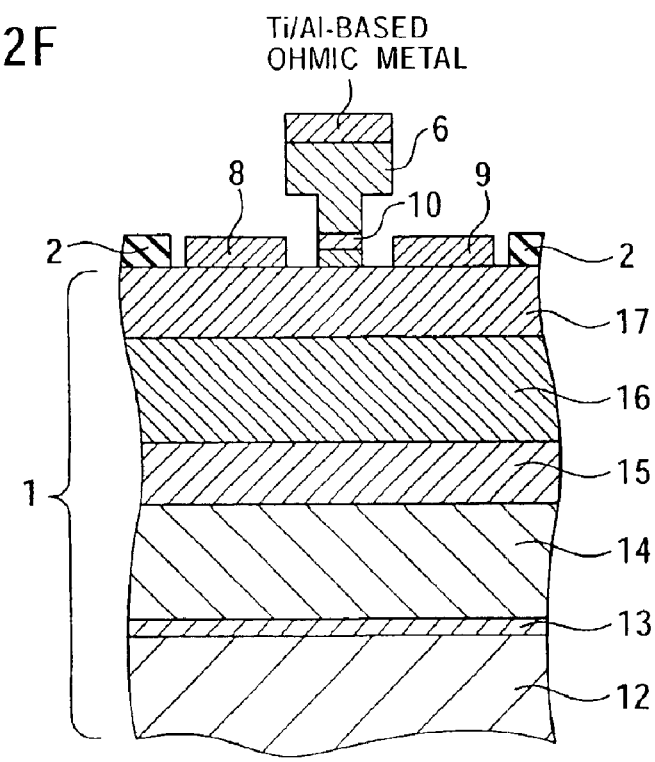

Furthermore, as shown in FIG. 2F, since the gate electrode 6 had the multi-layered structure including the high-melting point layer 10, it was possible to prevent the Ti/Al based ohmic metal which was deposited on the gate electrode 6 from affecting the gate electrode metal-semiconductor junction during the alloying treatment. Consequently, it was possible to maintain satisfactory gate electrode characteristics and it was possible to produce a superior field-effect semiconductor device.

Figure 3:
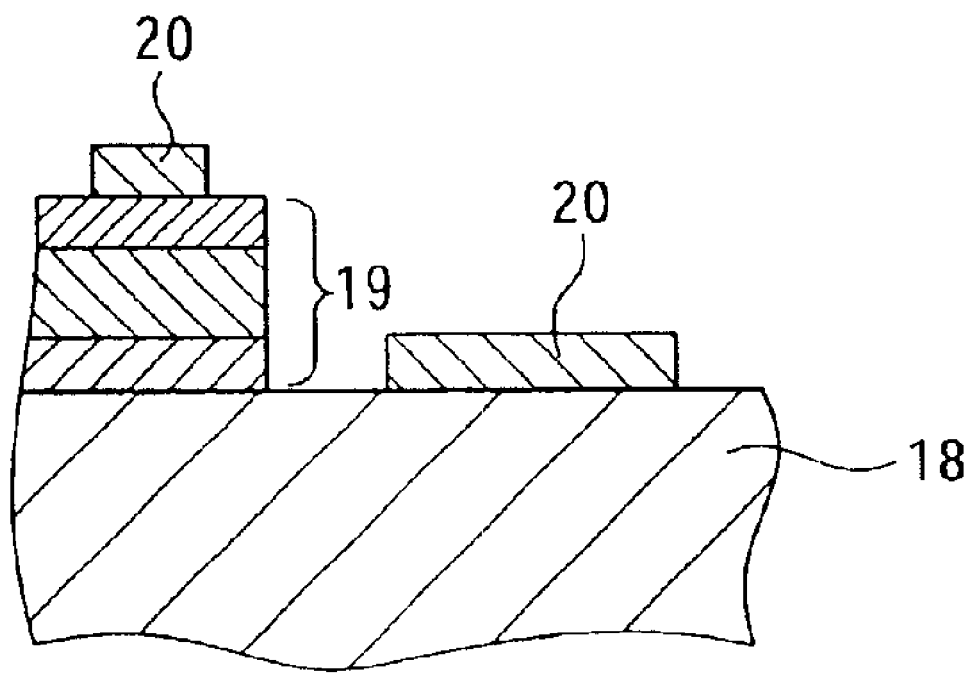
FIG. 3 is a sectional view which schematically shows a structure of a Schottky diode.

FIG. 3 is a sectional view which schematically shows a structure of a Schottky diode in which a layer including a high-melting-point metal was formed on a GaN layer 18 having an electron concentration on the order of $10^{17}$ with a thickness of approximately 1 $\mu$m. The Schottky diode was prepared in order to investigate the thickness of the high-melting-point metal layer.

A Schottky metal 19 which corresponds to the gate electrode is composed of Ni/Mo/Au, and a Ti/Al based ohmic metal 20 is deposited thereon.

Figure 4:
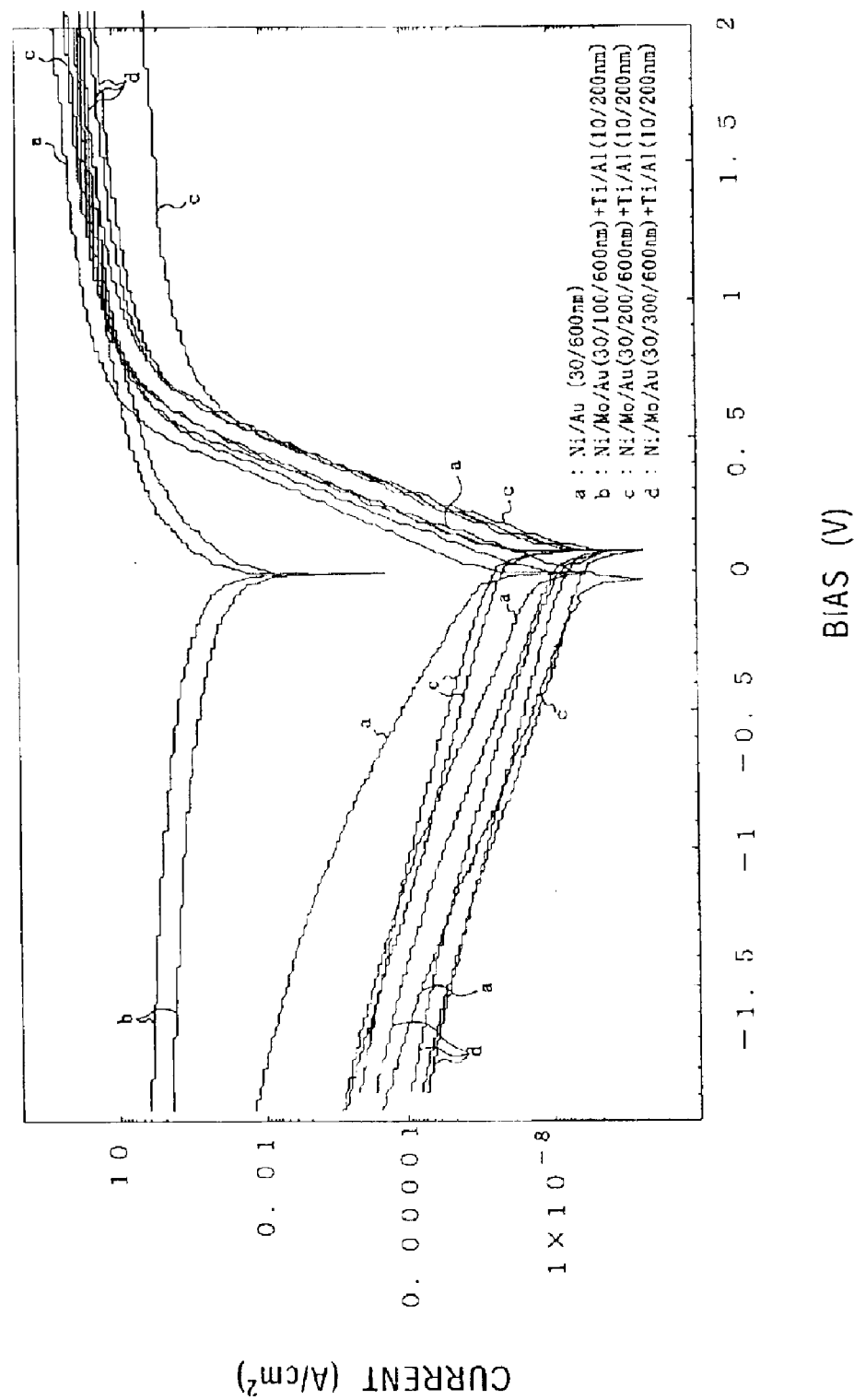
FIG. 4 is a graph showing the current-voltage characteristics of Schottky diodes with varied thicknesses of a Mo (high-melting-point metal) layer after alloying treatment.

Samples having the structure described above were prepared, in which the thickness of the high-melting-point metal layer composed of Mo was varied, and the current-voltage characteristics after ohmic alloying for each sample were measured. The measurement results are shown in FIG. 4. In the Schottky metal, the thickness of the Ni, Mo, and Au layers was set to be 30 nm; 100, 200, or 300 nm; and 600 nm; respectively, and a Ti/Al-based ohmic metal was deposited thereon with a thickness of 10 nm and 200 nm, respectively, for Ti and Al. After ohmic alloying was performed, the current-voltage characteristics were measured. As a comparative example, a sample was prepared in which a Schottky metal composed of Ni/Au (30 nm/600 nm) only was deposited, and a Ti/Al-based ohmic metal was not deposited on the Schottky metal layer. After ohmic alloying was performed, electrical characteristics after alloying treatment were checked.

As is clear from FIG. 4, with respect to the samples having a Mo thickness of 200 nm or more, Schottky characteristics are substantially the same as those of the comparative example including Ni/Au only, and the characteristics are not degraded. In contrast, with respect to the sample with a Mo thickness of 100 nm, the characteristics are extremely degraded. The reason for this is considered that the ohmic metal adversely affected the gate metal-semiconductor interface having satisfactory Schottky characteristics because of ohmic alloying. Consequently, in the field-effect semiconductor device of the present invention, by forming the gate electrode 6 so as to have a multi-layered structure including the high-melting-point metal layer 10, it is possible to prevent the ohmic metal deposited on the gate electrode 6 from affecting the metal-semiconductor junction during alloying treatment, and satisfactory gate electrode characteristics can be maintained. Therefore, it is possible to produce a superior field-effect semiconductor device. By setting the thickness of the high-melting point layer 10 at 200 nm or more, more satisfactory gate characteristics can be maintained.

EXAMPLE

An example of a field-effect semiconductor device of the present invention will be described, in which a gate electrode is formed so as to have a T-shaped cross section, the gate electrode not including a high-melting-point metal layer, and after a source electrode and a drain electrode are formed, an electrode material, such as an ohmic metal, for forming the source electrode and the drain electrode deposited on the gate electrode is removed.

Figure 5A:
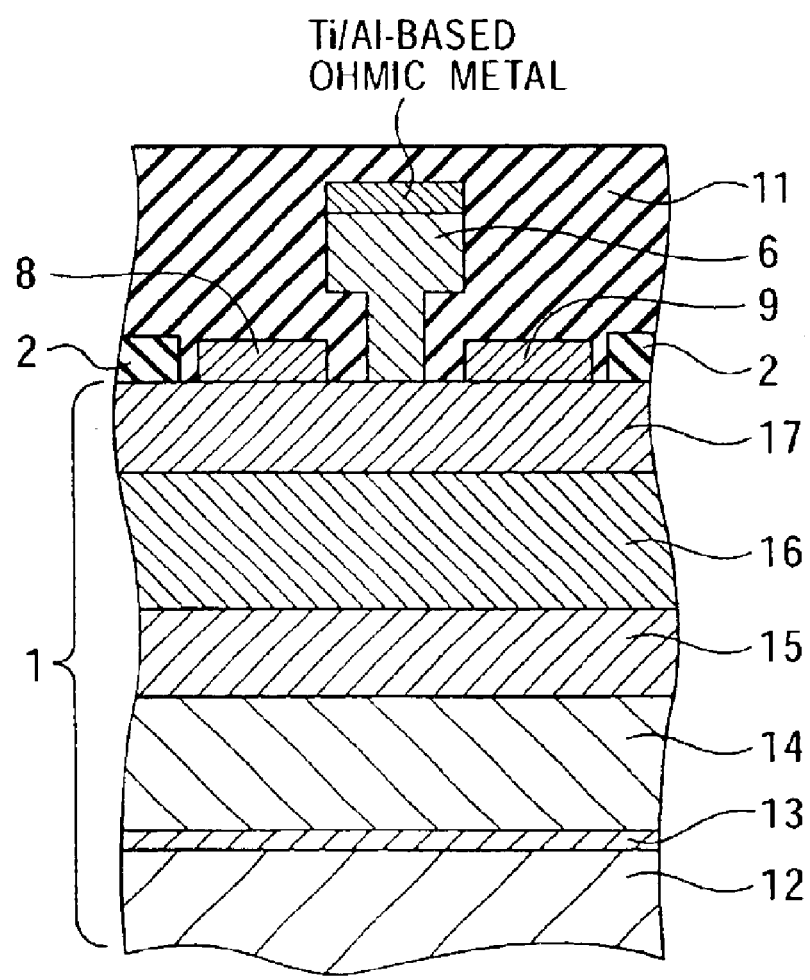
FIGS. 5A to 5C are sectional views which schematically show the steps in a method for fabricating a field-effect semiconductor device of the present invention.
Figure 5B:
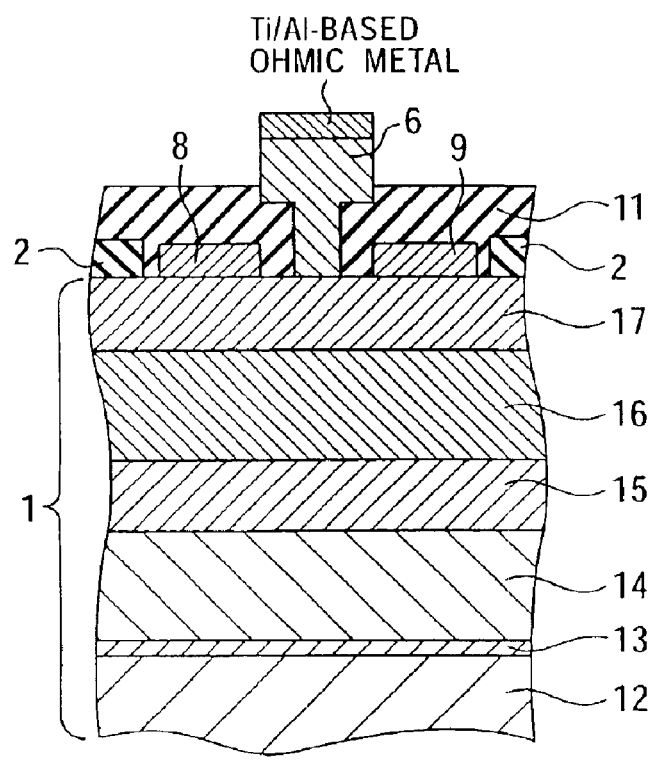
Figure 5C:
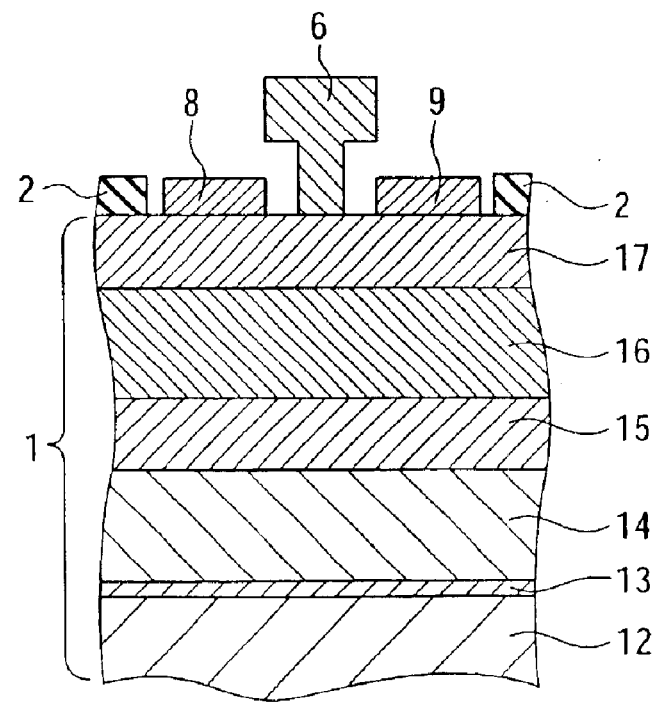

FIGS. 5A to 5C are sectional views which schematically show the steps in a method for fabricating a field-effect semiconductor device of the present invention.

Apart from the fact that the gate electrode 6 was composed of Ni/Au instead of Ni/Mo/Au, the field-effect semiconductor device was fabricated to the state shown in FIG. 2F in the same manner as that in Example 1. As shown in FIG. 5A, a sufficiently thick planarizing film 11 composed of a resist or the like was placed on the device in which a source electrode 8 and a drain electrode 9 were formed in a self-alignment manner using the gate electrode 6 as a mask.

Next, as shown in FIG. 5B, the surface of the planarizing film 11 was etched back until only the gate electrode 6 was exposed and the source electrode 8 and the drain electrode 9 were still covered with the planarizing film 11. The Ti/Al-based ohmic metal deposited on the gate electrode 6 was removed, for example, by an HCl-based etchant.

As shown in FIG. 5C, after the planarizing film 11 was removed, by performing the alloying treatment described above, the field-effect semiconductor device of the present invention was produced. FIGS. 6A and 6B are scanning electron microscope (SEM) images of the device before and after the removal of the Ti/Al-based ohmic metal deposited on the gate electrode 6. As is clear from the images shown in FIGS. 6A and 6B, the ohmic metal deposited on the gate electrode 6 was removed.

Figure 7:
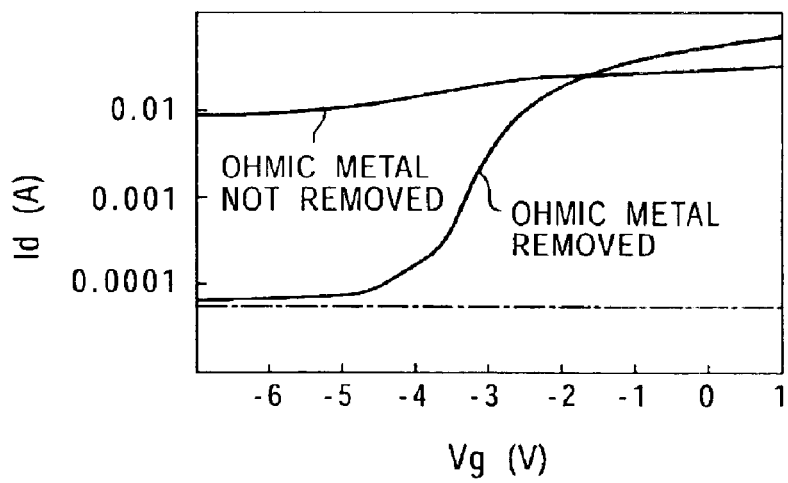
FIG. 7 is a graph showing the Id-Vg characteristics of a field-effect semiconductor device in which the ohmic metal deposited on the gate electrode is removed and a field-effect semiconductor device in which the ohmic metal deposited on the gate electrode is not removed (gate length×gate width: 0.4 $\mu$m×100 $\mu$m)

FIG. 7 is a graph showing the Id-Vg characteristics of a field-effect transistor in which the Ti/Al-based ohmic metal deposited on the gate electrode 6 was removed and a field-effect transistor in which the Ti/Al-based ohmic metal deposited on the gate electrode 6 was not removed. The transistor had a gate length of 0.4 μm and a gate width of 100 μm.

As is obvious from FIG. 7, by removing the Ti/Al-based ohmic metal deposited on the gate electrode 6, the off-state current was sufficiently reduced.

As described above, since the source electrode 8 and the drain electrode 9 were formed in the self-alignment manner using the gate electrode 6 as the mask, the distances between the gate electrode and the source electrode and between the gate electrode and the drain electrode were reduced, and it was possible to fabricate devices uniformly and with a high degree of consistency.

Consequently, it was possible to decrease the variation in parasitic resistance, such as resistance between the source and the gate and the resistance between the drain and the gate and to minimize the parasitic resistance, and it was possible to produce an excellent field-effect semiconductor device with improved characteristics.

Since the gate electrode 6 was formed so as to have a T-shaped cross section, the resistance of the gate electrode 6 was reduced, and it was possible to further improve the characteristics of the field-effect semiconductor device.

As shown in FIG. 5C, since the Ti/Al-based ohmic metal deposited on the gate electrode 6 was removed, it was possible to prevent the ohmic metal from affecting the gate electrode metal-semiconductor junction. Therefore, it was possible to maintain satisfactory electrode characteristics and it was possible to produce a superior field-effect semiconductor device.

EXAMPLE

Figure 10A:
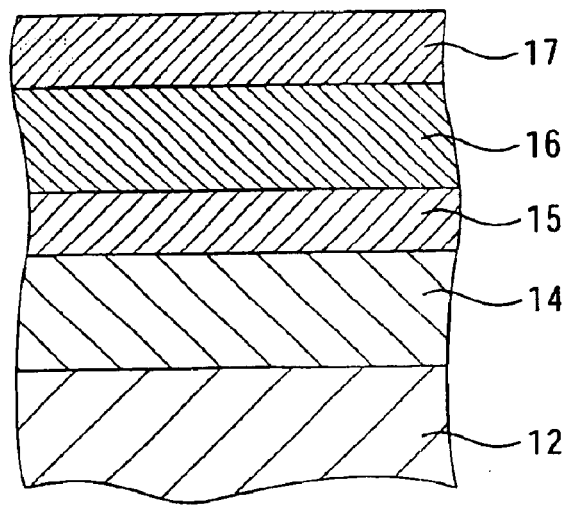
FIGS. 10A to 10F are sectional views which schematically show the steps in a method for fabricating a GaN-based field-effect transistor.
Figure 10B:
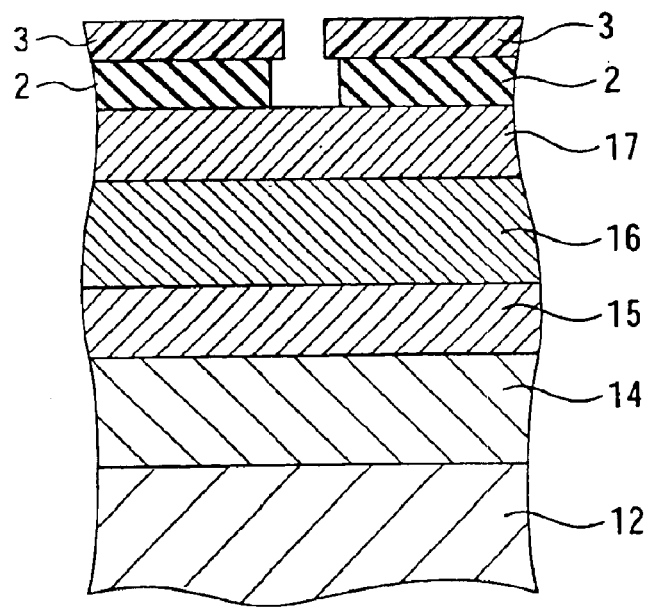
Figure 10C:
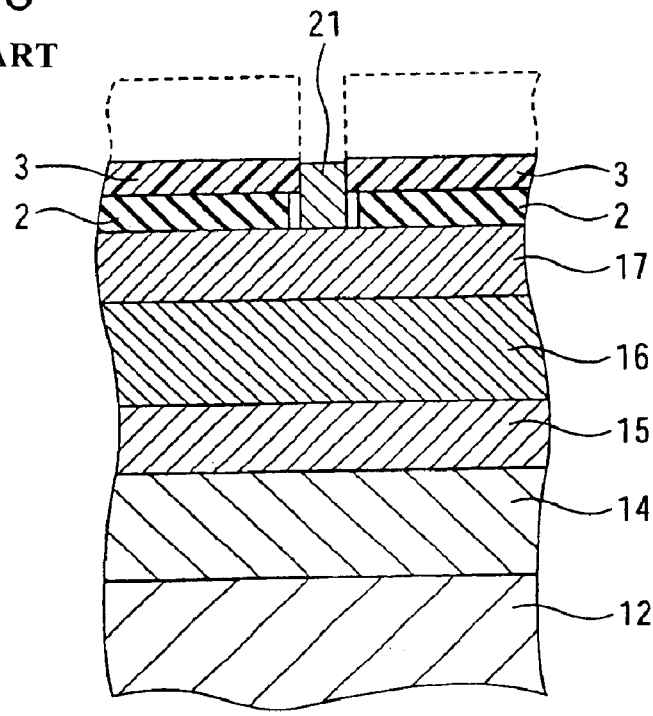
Figure 10D:
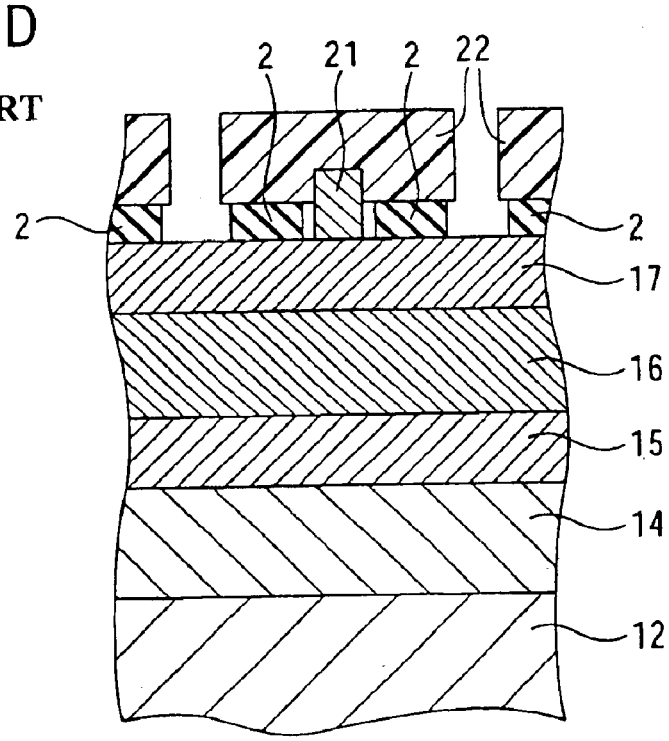
Figure 10E:
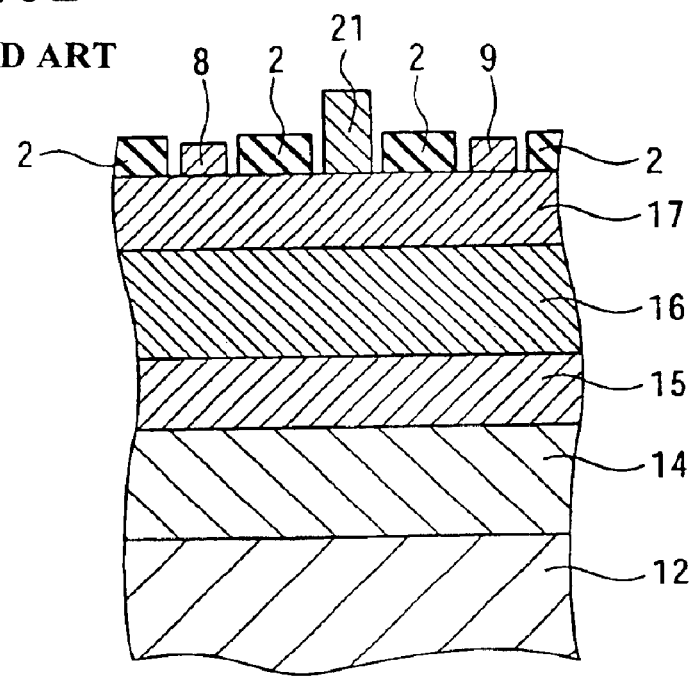
Figure 10F:
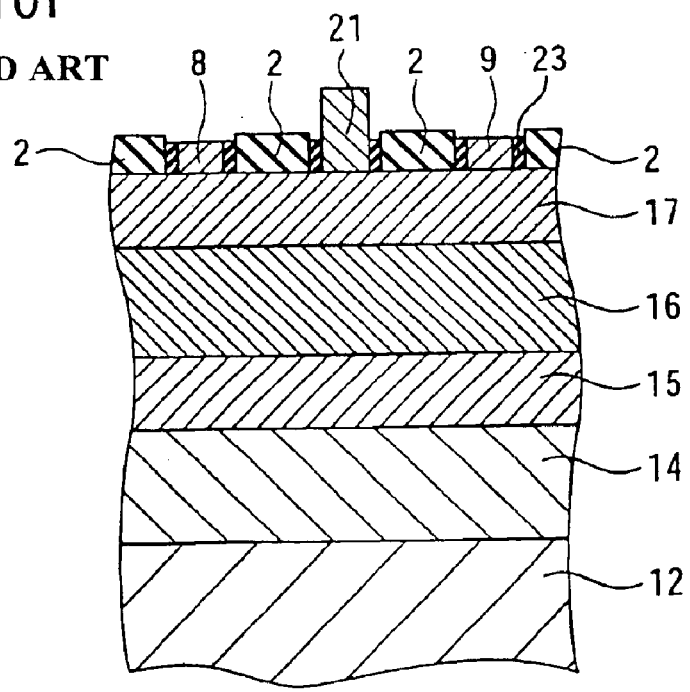
Figure 11A:
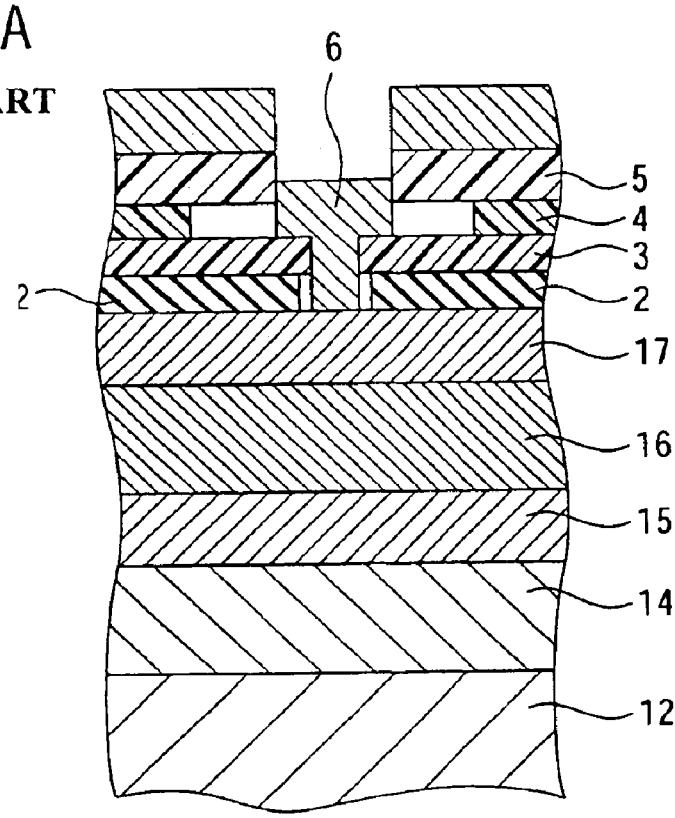
FIGS. 11A to 11C are sectional views which schematically show the steps in a method for fabricating a GaN-based field-effect transistor.
Figure 11B:
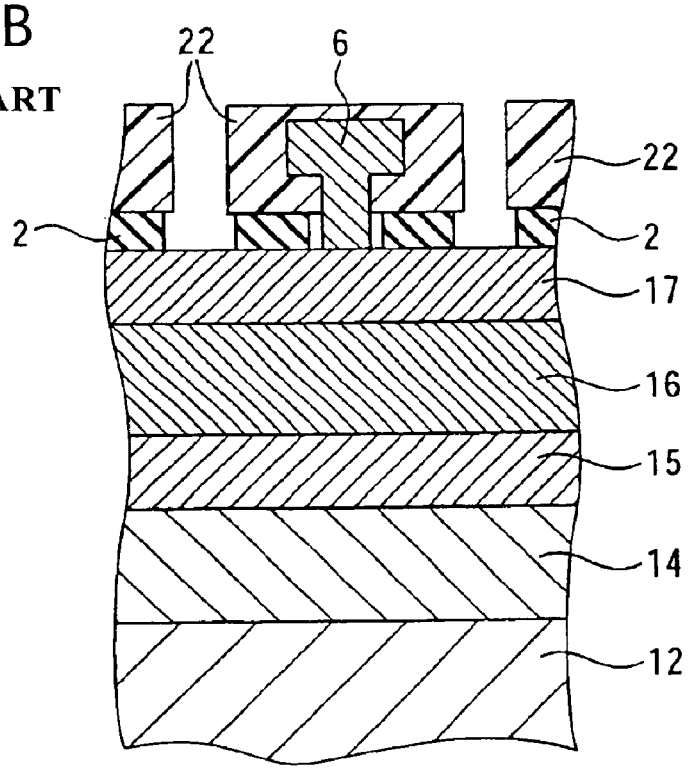
Figure 11C:
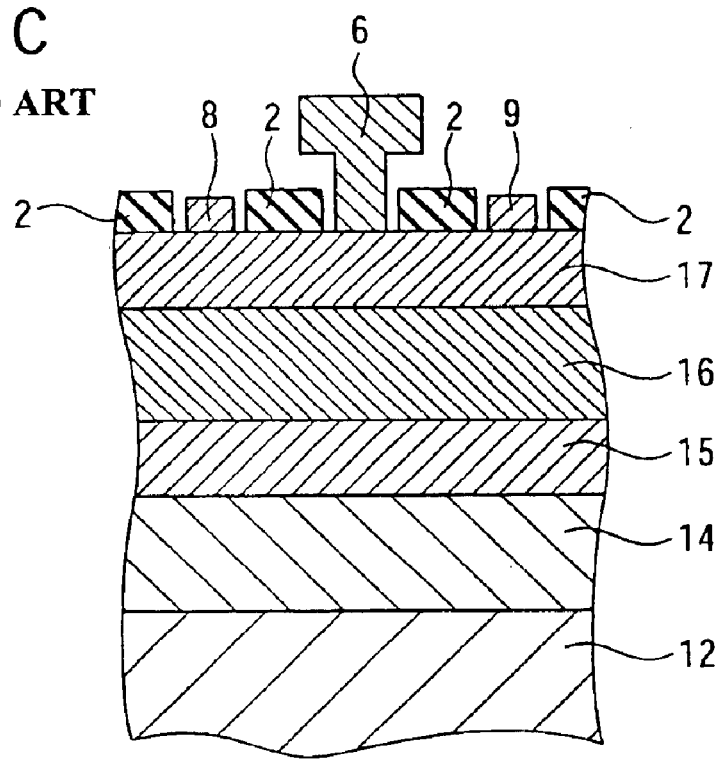

First, a device as shown in FIG. 10C was fabricated. That is, a rectangular gate electrode was formed instead of a T-shaped gate electrode, and the gate electrode, a source electrode, and a drain electrode were formed by patterning. This device is referred to as a device (a).

Next, a field-effect semiconductor device in accordance with the present invention was fabricated. That is, a T-shaped gate electrode was formed, and a source electrode and a drain electrode were formed in a self-alignment manner. The T-shaped gate electrode was formed so as to have a multi-layered structure including a high-melting-point metal layer, and a Ti/Al-based ohmic metal deposited on the T-shaped gate electrode was removed. This device is referred to as a device (b).

Figure 8:
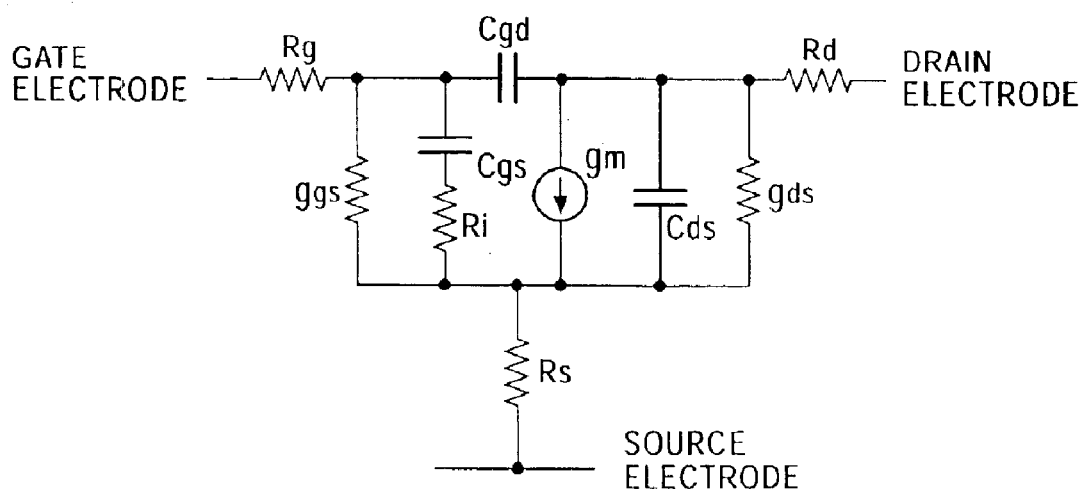
FIG. 8 is a diagram showing a small-signal equivalent circuit of a transistor.

With respect to the devices (a) and (b), small-signal circuit analysis was carried out. In the circuit analysis, a small-signal equivalent circuit of an assumed transistor shown in FIG. 8 was used, and by accomplishing the fitting of the s-parameters, which were obtained by small-signal measurement, of the device, the values of the individual components were obtained.

As a result of the circuit analysis, the device (a) had a gate resistance (Rg) of 2.7 Ω·mm and a source resistance (Rs) of 6.1 Ω·mm. The device (b) had a gate resistance (Rg) of 0.6 Ω·mm and a source resistance (Rs) of 3.5 Ω·mm. Consequently, in the field-effect semiconductor device of the present invention, the gate resistance (Rg) was decreased by the use of the T-shaped gate electrode, and since the source electrode and the drain electrode were formed by the self-alignment manner and it was also possible to prevent the gate electrode characteristics from being degraded by the ohmic metal, the source resistance (Rs) and the drain resistance (Rd) were decreased. Therefore, it was possible to improve the device characteristics.

EXAMPLE

Figure 9A:
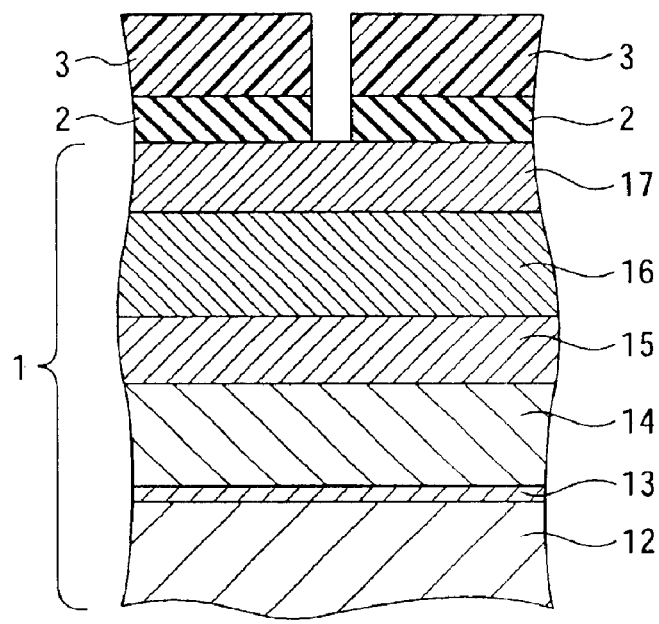
FIGS. 9A and 9B are sectional views which schematically show the steps in a method for fabricating a field-effect semiconductor device of the present invention.
Figure 9B:
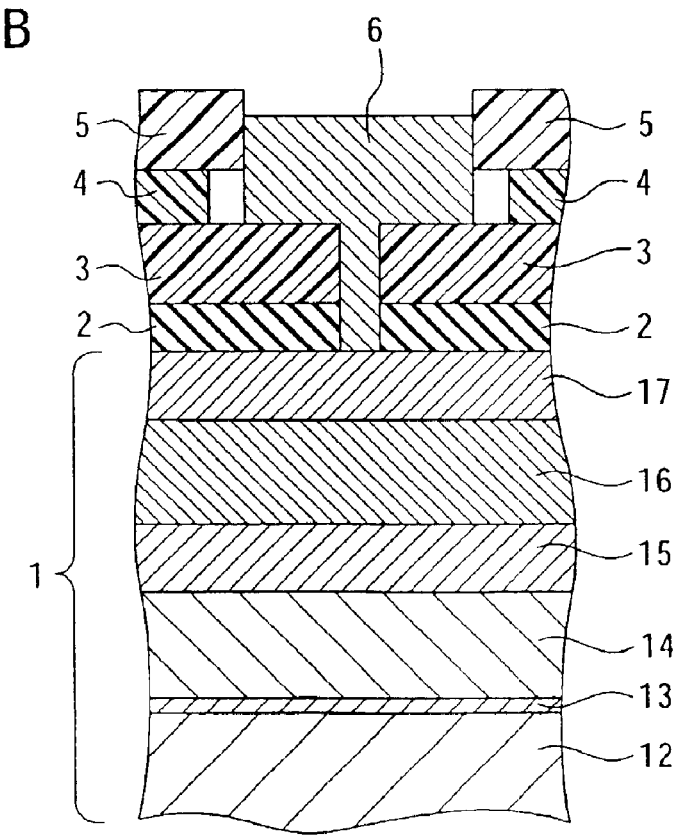

FIGS. 9A and 9B are sectional view which schematically show the steps in a method for fabricating a fine T-shaped gate electrode 6 on the order of 0.1 μm.

As shown in FIG. 9A, a first resist layer 3 provided with an opening corresponding to the gate electrode-forming region was placed on a $SiO_2$ insulating film 2 formed on a semiconductor base 1. An opening was formed in the $SiO_2$ insulating film 2, with a predetermined size of the gate electrode 6, by dry etching, such as reactive ion plasma etching using a gas containing $CF_4$.

Next, as shown in FIG. 9B, a second resist layer 4 and a third resist layer 5 were placed on the first resist layer 3, and an opening corresponding to the region of the overhang of the T-shaped gate electrode 6 was formed. A metal (such as Ni/Au) for forming the gate electrode 6 was then deposited thereon. The subsequent fabrication steps are the same as those described above. That is, a source electrode and a drain electrode are formed in a self-alignment manner using the gate electrode 6 as a mask.

Although the present invention has been described with reference to the embodiments and the examples, it is to be understood that the invention is intended to cover various modifications and equivalent arrangements based on the technical idea of the present invention.

That is, although the gate electrode with a T-shaped cross section has been described in each of the examples, the shape of the gate electrode is not limited to this. The gate electrode may be formed into any shape as long as the gate electrode is allowed to be used as a mask. The source electrode and the drain electrode may be formed in a self-alignment manner using a side-wall technique instead of using the T-shaped gate electrode.

An example in which at least a part of the gate electrode is composed of a high-melting-point metal and an example in which an electrode material for forming a source electrode and a drain electrode deposited on a gate electrode is removed have been described. In a field-effect semiconductor device of the present invention, at least a part of the gate electrode may be composed of a high-melting-point metal and also the electrode material deposited on the gate electrode may be removed. However, in the device in which at least a part of the gate electrode is composed of a high-melting-point metal, since the electrode material is deposited on the gate electrode, the gate electrode resistance can be further decreased, thus improving the device characteristics.

In each of the examples described above, the compound semiconductor base 1 is formed by epitaxially growing the AlGaN low temperature buffer layer 13, the GaN high resistivity layer 14, the AlGaN spacer layer 15, the Sidoped AlGaN layer 16, and the AlGaN cap layer 17 in that order on the sapphire substrate 12. However, instead of Al, In may be used in the present invention.

What is claimed is:

1. A field-effect semiconductor device comprising:

a semiconductor layer comprising semiconductor represented by the formula $Al_xIn_yGa_{1-x-y}N$, wherein x+y<1, 0≦x <1, and 0≦y<1;

a gate electrode formed on the semiconductor layer; and a source electrode and a drain electrode formed by self-alignment using the gate electrode as a mask, wherein the semiconductor layer comprises a spacer layer, a Si-containing carrier-supplying layer, and a cap layer; the spacer layer, the Si-containing carrier-supplying layer, and the cap layer comprising the gallium nitride-based compound semiconductor represented by the formula $Al_xIn_yGa_{1-x-y}N$, wherein the field-effect semiconductor device further comprises a GaN-based channel layer, and the spacer layer, the Si-containing carrier-supplying layer, and the cap layer are deposited in that order on the GaN-based channel layer, wherein the gate electrode, the source electrode, and the drain electrode are formed on the cap layer, and wherein the gate electrode has a multi-layered structure including a layer comprising a high-melting point metal.

2. A field-effect semiconductor device according to claim 1, wherein the gate electrode has a predetermined pattern, and the source electrode and the drain electrode are formed by vapor deposition using an electrode material.

3. A field-effect semiconductor device according to claim 1, wherein the gate electrode has a T-shaped cross section, and the source electrode and the drain electrode are lower than the bottom face of an overhang of the T-shaped gate electrode.

4. A field-effect semiconductor device according to claim 2, wherein the electrode material deposited on the gate electrode is removed after the formation of the source electrode and the drain electrode.

5. A field-effect semiconductor device according to either claim 1, wherein the high-melting-point metal comprises at least one metal selected from the group consisting of Mo, Pt, W, Hf, and Cr.

6. A field-effect semiconductor device according to claim 1, wherein the layer comprising the high-melting-point metal has a thickness of 200 nm or more.

* * * * *